United States Patent [19]
Yamada et al.

[11] Patent Number: 5,506,808
[45] Date of Patent: Apr. 9, 1996

[54] SEMICONDUCTOR MEMORY DEVICE AND METHOD FOR READING DATA

[75] Inventors: Katsuyuki Yamada; Tohru Yasuda, both of Kasugai, Japan

[73] Assignees: Fujitsu Limited, Kawasaki; Fujitsu VLSI Limited, Kasugai, both of Japan

[21] Appl. No.: 305,715

[22] Filed: Sep. 14, 1994

[30] Foreign Application Priority Data

Sep. 14, 1993 [JP] Japan .................................. 5-229226

[51] Int. Cl.⁶ .................................................. G11C 7/00
[52] U.S. Cl. ........................ 365/208; 365/177; 365/203; 365/189.05
[58] Field of Search ................................... 365/207, 208, 365/190, 177, 203, 189.05

[56] References Cited

U.S. PATENT DOCUMENTS

| 4,829,479 | 5/1989 | Mitsumoto | 365/177 X |
|---|---|---|---|
| 4,866,673 | 9/1989 | Higuchi | 365/177 |
| 4,916,668 | 4/1990 | Matsui | 365/233 X |
| 5,091,889 | 2/1992 | Hamano | 365/203 X |
| 5,331,233 | 7/1994 | Urakawa | 365/190 X |

*Primary Examiner*—David C. Nelms
*Assistant Examiner*—Son Mai
*Attorney, Agent, or Firm*—Nikaido, Marmelstein, Murray & Oram

[57] ABSTRACT

Disclosed is a data reading process as well as an improved semiconductor memory device. Input data supplied to the memory device is written in one of memory cells via a pair of bit lines when a write enable signal is active. After writing of the input data is completed, an equalizing circuit is activated to equalize the potential levels of bit lines used in data writing. An output circuit of the memory device is controlled such that the input data is forcibly output as output data from the memory device during the equalization immediately after writing of the input data is completed.

8 Claims, 11 Drawing Sheets

SEMICONDUCTOR MEMORY DEVICE AND METHOD FOR READING DATA

BACKGROUND OF THE INVENTION

1. Field of the Invention

The present invention relates generally to a data reading method for use in a semiconductor memory device and a semiconductor memory device capable of executing the method. More particularly, this invention relates to a method of shortening the time necessary for a semiconductor memory device to perform data reading operations immediately following data writing operations.

2. Description of the Related Art

Random access memory (RAM) is a typical component of most computer systems. Increasingly, RAM memory is being used as buffer memory in such systems due to the fast operational characteristics of RAM devices. With the increasing speeds of modern computer systems, it is important that RAM devices continue to increase their operational speed. One of the more typical ways to achieve this is to shorten the address access time in a RAM. An alternative approach is to have a shorter data reading time in addition to the faster address access time, even immediately after data writing into the RAM. To address the second demand, the potential level of bit line pairs can be equalized for a given period of time after data writing. The equalizing of the potentials of the bit line pairs will be described in more detail, with reference to prior art.

FIG. 1 shows the essential portions of a typical static RAM (SRAM). A memory cell 51 is an ordinary high-resistance load type cell, and includes first and second driver transistors 61 and 62, first and second transfer transistors 63 and 64, and first and second load resistors R1 and R2. The transistors 61 to 64 each are an N channel MOS transistor. The first transfer transistor 63, connected between a bit line BL and the drain of the first driver transistor 61, has a gate connected to a word line WL. The second transfer transistor 64, connected between the bit line /BL and the drain of the second driver transistor 62, has a gate connected to the word line WL. The first driver transistor 61 has a drain connected via the first load resistor R1 to a power line of a high potential $V_{CC}$, a source connected to a power line of a low potential $V_{SS}$, and a gate connected to the drain of the second driver transistor 62. The second driver transistor 62 has a drain connected via the second load resistor R2 to the power line of the high potential $V_{CC}$, a source connected to the power line of the low potential $V_{SS}$, and a gate connected to the drain of the first driver transistor 61.

An equalizer 52 includes three PMOS transistors 65, 66 and 67. The PMOS transistor 65 is connected between the bit lines BL and /BL. The PMOS transistor 66 is connected between the bit line BL and the power line of the high potential $V_{CC}$. The PMOS transistor 67 is connected between the bit line /BL and the power line of the high potential $V_{CC}$. The individual PMOS transistors 65–67 have gates which receive an equalizer pulse EQ from an external device (not shown). When the equalizer pulse EQ of a L level is input to the gates of the PMOS transistors 65–67, those PMOS transistors 65–67 are turned on. When the PMOS transistor 65 turns on, the pair of bit lines BL and /BL are electrically connected. When the PMOS transistors 66 and 67 turn on, the pair of bit lines BL and /BL and the power line of the high potential $V_{CC}$ are electrically connected. As a result, the bit lines BL and /BL are pulled up to the high potential $V_{CC}$ side.

A conventional differential bipolar sense amplifier is incorporated as the sense amplifier 53. The sense amplifier 53 includes first and second emitter followers and a differential amplifier, which will be discussed below.

The first emitter follower has first and second NPN transistors Q1 and Q2, first and second diodes D1 and D2 and first and second NMOS transistors 72 and 74. The first NPN transistor Q1 has a base connected to the bit line BL, a collector connected to the power line of the high potential $V_{CC}$ and an emitter connected to the power line of the low potential $V_{SS}$ via the first diode D1 and the first NMOS transistor 72. The second NPN transistor Q2 has a base connected to the bit line /BL, a collector connected to the power line of the high potential $V_{CC}$ and an emitter connected to the power line of the low potential $V_{SS}$, via the second diode D2 and the second NMOS transistor 74.

The differential amplifier in the sense amplifier 53 has two NPN transistors Q3 and Q4, two PMOS transistors 70 and 71 and an NMOS transistor 73. The emitters of both NPN transistors Q3 and Q4 are connected together, and are connected via the NMOS transistor 73 to the power line of the low potential $V_{SS}$. The NPN transistor Q3 has a base connected to the cathode of the diode D1, and a collector connected via the PMOS transistor 70 to the power line of the high potential $V_{CC}$. The NPN transistor Q4 has a base connected to the cathode of the diode D2, and a collector connected via the PMOS transistor 71 to the power line of the high potential $V_{CC}$.

The PMOS transistors 70 and 71 have their gates connected to a reference power supply $V_{REF}$, and serve as load resistors of the differential amplifier. The NMOS transistors 72 to 74 also have their gates connected to the reference power supply $V_{REF}$, and serve as load resistors of the first emitter follower and the differential amplifier.

The second emitter follower in the sense amplifier 53 has a third and fourth NPN transistors 68 and 69 and a bias power supply. The third NPN transistor 68 has a base connected to the collector of the NPN transistor Q3, a collector connected to the power line of the high potential $V_{CC}$ and an emitter connected to the power line of the low potential $V_{SS}$ via the bias power supply. The fourth NPN transistor 69 has a base connected to the collector of the NPN transistor Q4, a collector connected to the power line of the high potential $V_{CC}$ and an emitter connected to the power line of the low potential $V_{SS}$, via the bias power supply. Voltages generated on the bit lines BL and /BL are differentially amplified respectively by the NPN transistors Q3 and Q4, and the amplified voltages are output as output data to a main sense amplifier portion (hereinafter called "MSA") 55 as shown in FIG. 2, through nodes A and B provided between the emitters of the third and fourth NPN transistors 68 and 69 and the bias power supply.

A bit driver 54 shown in FIG. 1 includes two NMOS transistors 77 and 78, and four PMOS transistors 75, 76, 79 and 80. The transistors 75 and 76 are controlled based on a select signal YC from a Y decoder (i.e., column decoder, not shown). The transistors 77 to 80 are controlled based on another select signal YCW. When one of the bit line pairs is selected, the low level select signal YC turns on the associated transistors 75 and 76. When the bit line pair is not selected, a high level select signal turns off the associated transistors 75 and 76. Another select signal YCW is set at a H level during data writing mode, and has an L level during data reading mode and during non-selection of the bit line pair. Accordingly, the pair of bit lines BL and /BL is connected with the sense amplifier 53 during the data writing and reading modes. In the data writing mode, input data Din, /Din, transferred onto the bit lines BL and /BL from a write amplifier (not shown) is written into the associated memory cell 51.

FIG. 2 shows the circuit constitution of the MSA 55 and an output buffer portion 56 in the SRAM. The MSA 55 includes a differential amplifier and an emitter follower which will be discussed below. The MSA's differential amplifier comprises two NPN transistors Q5 and Q6 and two resistors R3 and R4. The emitters of both NPN transistors Q5 and Q6 are connected together to the power line of the low potential $V_{SS}$ via the bias power supply. The NPN transistor Q5 has a base connected to the node A in the sense amplifier 53 and a collector connected via the resistor R3 to the power line of the high potential $V_{CC}$. The NPN transistor Q6 has a base connected to the node B in the sense amplifier 53 and a collector connected via the resistor R4 to the power line of the high potential $V_{CC}$. Accordingly, the output of the sense amplifier 53 is differentially amplified by both NPN transistors Q5 and Q6.

The emitter follower of the MSA 55 has first and second NPN transistors 81 and 82 and a bias power supply. The first NPN transistor 81 has a base connected to the collector of the NPN transistor Q5, a collector connected to the power line of the high potential $V_{CC}$ and an emitter connected via the bias power supply to the power line of the low potential $V_{SS}$. The second NPN transistor 82 has a base connected to the collector of the NPN transistor Q6, a collector connected to the power line of the high potential $V_{CC}$ and an emitter connected via the bias power supply to the power line of the low potential $V_{SS}$. Signals differentially amplified respectively by the NPN transistors Q5 and Q6 are output to the output buffer portion 56 via the first and second NPN transistors 81 and 82.

The output buffer portion 56 includes a differential amplifier and an emitter follower which will be discussed below. The differential amplifier comprises three NPN transistors 83, 84 and 23, two resistors R5 and R6, a diode D3 and a bias power supply. The emitters of the individual transistors 83, 84 and 23 are connected together to the power line of the low potential $V_{SS}$ via the bias power supply. The NPN transistor 83 has a base connected to the emitter of the first NPN transistor 81 and a collector connected via the resistor R5 to the power line of the high potential $V_{CC}$. The NPN transistor 84 has a base connected to the emitter of the second NPN transistor 82 and a collector connected via the resistor R6 to the power line of the high potential $V_{CC}$. The diode D3 is provided between both NPN transistors 83 and 84. The differential output of the MSA 55 is differentially amplified by both NPN transistors 83 and 84.

The NPN transistor 23 has a collector connected to the collector of the transistor 84 and an emitter connected to the emitter of the transistor 84. The base of the transistor 23 receives a signal SG1 obtained by a logical combination of a write enable signal /WE, a chip select signal /CS and an output enable signal /OE. The logical combined signal SG1 turns on the transistor 23 in order to satisfy the specifications that the output data Dout should maintain an L level at the time of data writing (i.e., when the write enable signal /WE has an L level).

The emitter follower of the output buffer portion 56 is composed of an NPN transistor 85, which has a base connected to the collector of the NPN transistor 84, a collector connected to the power line of the high potential $V_{CC}$ and an emitter connected to an output terminal 90. A signal differentially amplified by both NPN transistors 83 and 84 is output as output data Dout of the SRAM via the NPN transistor 85 and output terminal 90. When the base of the transistor 23 receives the signal SG1, resulting from the logical combination of the write enable signal /WE, chip select signal /CS and output enable signal /OE at the time of data writing, the NPN transistor 85 is turned off, causing the output data Dout to have an L level.

FIG. 3 shows a time chart which illustrates the levels of an address signal Add, and the write enable signal /WE during the period when, according to the conventional art, data is written to the SRAM. A setup time $t_{SA}$ is the time from the switching of the address signal, Add, to the falling of the write enable signal /WE to the L level. A holdup time $t_{HA}$ is the time from the rising of the write enable signal /WE to the H level to the next switching of the address signal Add. An address access time $t_{AA}$ is the time from the switching of the address signal Add to the point at which the output data Dout corresponding to that selected address is output. A write recovery time $t_{WR}$ is the time necessary to read data immediately after the data writing. That is, the write recovery time $t_{WR}$ is the time from the rising of the write enable signal /WE to the point at which the output data Dout, held at the L level for a specific period of time, is established as an output relating to specific write data.

In the conventional SRAM, in reading mode immediately after data writing, the potential levels of the bit lines BL and /BL are equalized for a given period of time after data is written. This equalization process quickens the recovery of the bit lines BL and /BL after data writing. Since the bit lines BL and /BL are equalized, the level difference between both bit lines BL and /BL produced in write mode disappears, and both bit lines BL and /BL have the same potential. This permits the next reading operation to be executed at a high speed.

When the level difference between both bit lines BL and /BL becomes zero, the level of the output signal of the sense amplifier 53 (i.e., the potential levels at the nodes A and B) changes to an intermediate level between that of a high and low level. Consequently, the level of the input signal to the MSA 55 becomes an intermediate level so that the output data Dout temporarily becomes an intermediate level. This phenomenon will be described based on the time chart given in FIG. 4.

Suppose that the write enable signal /WE falls to the L level and the potential at the bit line BL becomes higher than that of the bit line /BL, in accordance with the input data Din, /Din to be written in the memory cell 51. Since an H-level voltage is applied to the base of the transistor Q1 via the bit line BL, the base of the transistor Q3 becomes an H level. Since an L-level voltage is applied to the base of the transistor Q2 via the bit line /BL, the base of the transistor Q4 falls low. During the L-level duration of the write enable signal /WE, the transistor 23 is in an ON state, so that the output data Dout is kept at the L level regardless of the respective status of the bit lines BL and /BL.

Writing of the input data Din, /Din to the memory cell 51 is completed when the write enable signal /WE rises to an H level. The transistor 23 is turned off in synchronism with the completion of that writing, and the transistor 85 tries to output the written data as output data Dout. When writing operation is completed, the equalizer pulse EQ having an L level is input to the equalizer 52 from the external device (not shown). Then, the equalizer 52 short-circuits both bit lines BL and /BL at a potential close to the high potential $V_{CC}$ to set the potentials of both bit lines BL and /BL equal to each other. As a result, the currents flowing through both transistors Q3 and Q4 in the sense amplifier 53 become equal to each other, and the potentials at the nodes A and B become equal to each other. This sets the base potentials of the transistors Q5 and Q6 of the MSA 55 equal to each other. Therefore, the output data Dout read immediately after data writing temporarily settles at an intermediate potential level, producing a glitch or anomaly in the data reading operation, as shown in FIG. 4.

In order to accelerate the speed of reading data immediately after data writing in the SRAM, it is common to shorten both the address access time $t_{AA}$ and the write recovery time $t_{WR}$. When a glitch occurs in the output data Dout read out immediately after writing, the write recovery time $t_{WR}$ increases accordingly. As shown in FIG. 4, the write recovery time $t_{WR2}$ for the case where a glitch occurs is longer than the write recovery time $t_{WR1}$ for the case where no glitch occurs.

Suppose that the switching of the address Add is carried out with a glitch produced, and that H-level output data Dout is read out. Since this output data Dout should rise to the H level from the glitch-based intermediate level, the time for outputting the H-level output data Dout is delayed accordingly. This not only affects the address access time $t_{AA}$, but consequently, increases the time for reading data immediately after data writing operations.

SUMMARY OF THE INVENTION

Accordingly, it is therefore a primary objective of the present invention to provide a data reading method for a semiconductor memory device, which suppresses the occurrence of a disruption in reading operations originated from the equalization of bit lines after data writing to realize an increase in the speed of a reading operation immediately after writing.

It is another objective of this invention to provide a semiconductor memory device which is designed to execute the data reading method of this invention.

To achieve the foregoing and other objects and in accordance with the purpose of the present invention, an improved data reading method is provided for use in a semiconductor memory device having a plurality of memory cells and plural pairs of bit lines.

According to the data reading method of the present invention, input data supplied to the memory device is written in one of the memory cells via a pair of bit lines in response to a write enable signal. After writing of the input data is completed, a bit line equalization is performed to equalize the potential levels of the bit lines used during the data writing operation. The input data is forcibly output as output data from the memory device during the equalization immediately after writing of said input data is completed.

An improved semiconductor memory device according to the present invention comprises a memory cell 1 connected to a pair of bit lines BL and /BL and a word line WL, a write amplifier 3 for writing input data $D_{in}$ in the memory cell 1 via the pair of bit lines BL and /BL in response to an enable signal, an equalizer 2 for equalizing the potential levels of the pair of bit lines BL and /BL after the input data $D_{in}$ is written to the memory cell 1, and a sense amplifier 4 coupled to the pair of bit lines BL and /BL, as shown in FIG. 12. The memory device further comprises an output circuit 5 and a control circuit 6 for the output circuit. The output circuit 5 reads data from the memory cell 1, via the pair of bit lines BL and /BL and the sense amplifier 4, and outputs the read data as output data $D_{out}$. The output circuit 5 fixes the potential level of the output data to either a low potential or a high potential while the enable signal is active. The control circuit 6 forces the output circuit 6 to output the input data $D_{in}$ as output data $D_{out}$ during the equalization of the pair of bit lines BL and /BL by the equalizer 2.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

First Embodiment

Figure 5:
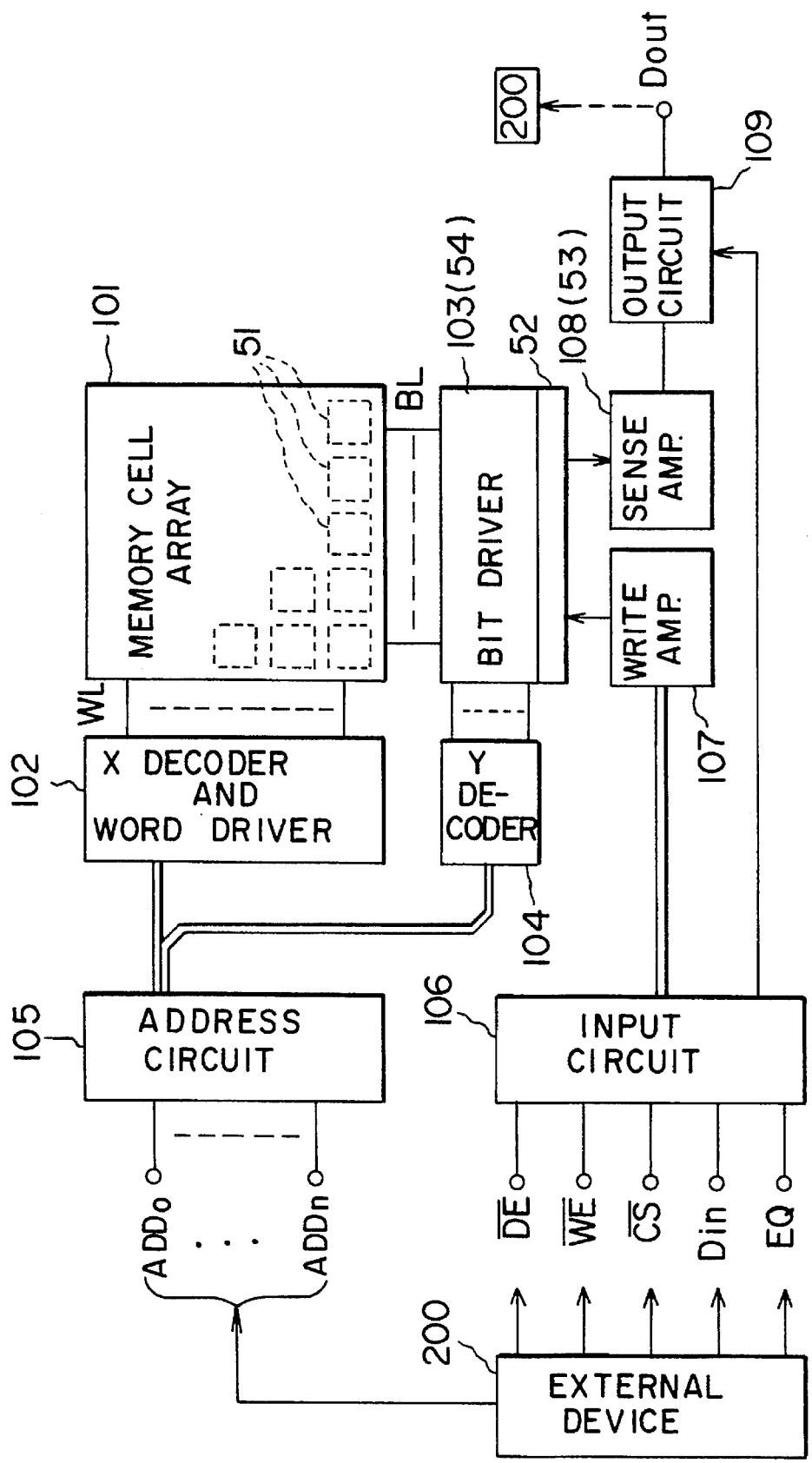
FIG. 5 is a block diagram showing the general structure of an SRAM according to a first embodiment of the present invention.

An SRAM according to a first embodiment of the present invention will now be described referring to FIGS. 5 through 8. FIG. 5 shows the schematic structure of the SRAM as a semiconductor memory device. The SRAM, formed on a semiconductor chip, includes a memory cell array 101, an X (row) decoder and word driver 102, a bit driver 103 (54), a Y (column) decoder 104, an address circuit 105, an input circuit 106, a write amplifier 107, a sense amplifier 108 (53) and an output circuit 109 (55, 56).

The memory cell array 101 comprises a plurality of memory cells 51 arranged two-dimensionally. Each memory cell 51 stores 1-bit data. The address circuit 105 receives address data Add ($Add_0$–$Add_n$) from an external device 200, and sends the data to the X decoder/word driver 102 and the Y decoder 104. The X decoder and word driver 102 selects one of word lines WL based on the address data Add. The Y decoder 104 activates the bit driver 103 to select a pair of bit lines BL and /BL based on the address data Add. A memory cell targeted for data reading or data writing is determined by the selected word line WL and bit lines BL and /BL.

The input circuit 106 receives an output enable signal /OE, a write enable signal /WE, a chip select signal /CS input data, Din, to be written in a memory cell and an equalizer pulse signal EQ. When the chip select signal /CS is at a L level and the write enable signal /WE falls low, the input circuit 106 outputs the input data Din to the write amplifier 107. The input data Din as well as its complementary data /Din is sent to the selected bit lines BL and /BL from the write amplifier 107 via the bit driver 103. The input data Din, /Din is written in the memory cell specified by the selected bit lines BL and /BL and word line WL.

Figure 1:
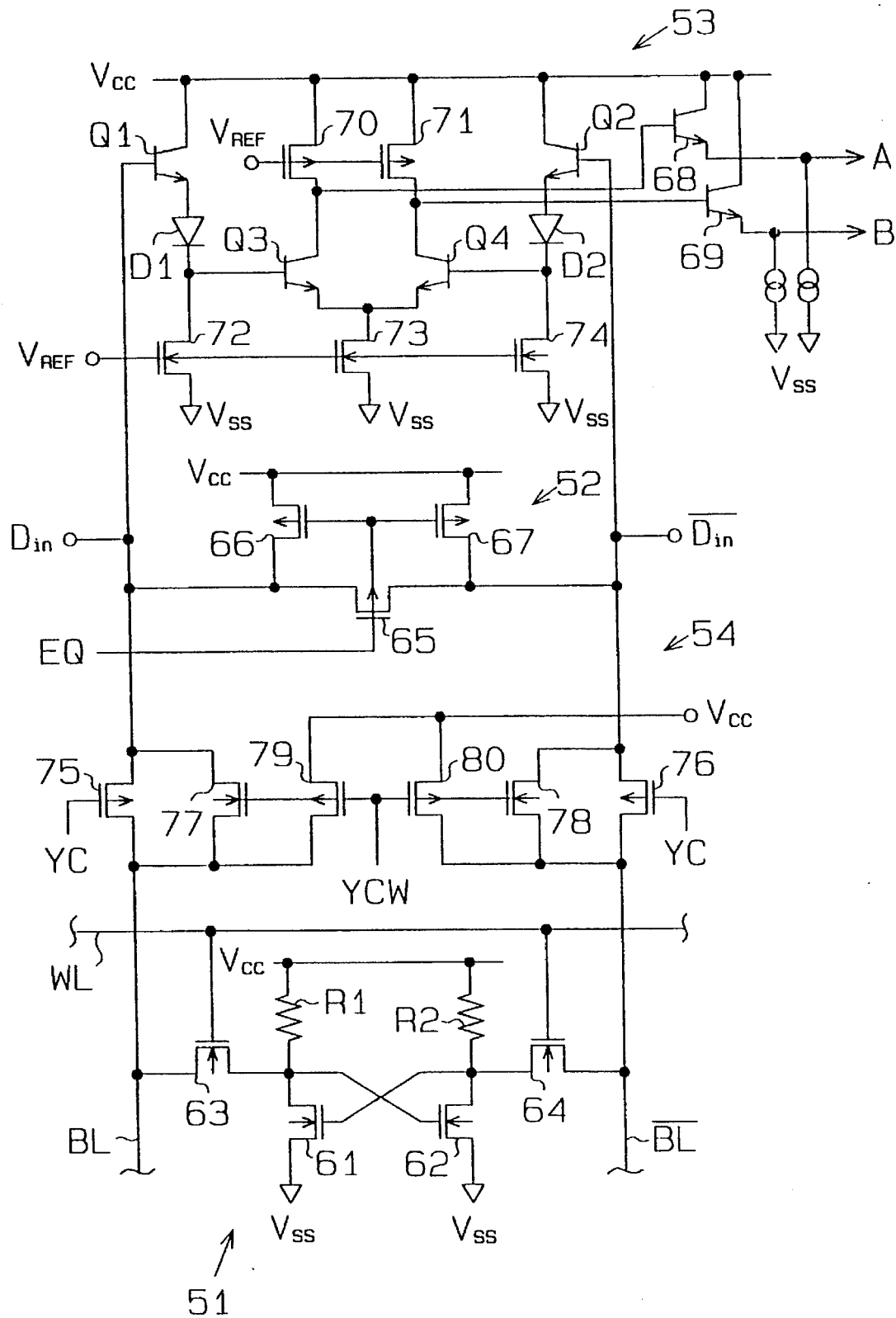
FIG. 1 is a circuit diagram showing essential portions of a conventional SRAM.
Figure 6:
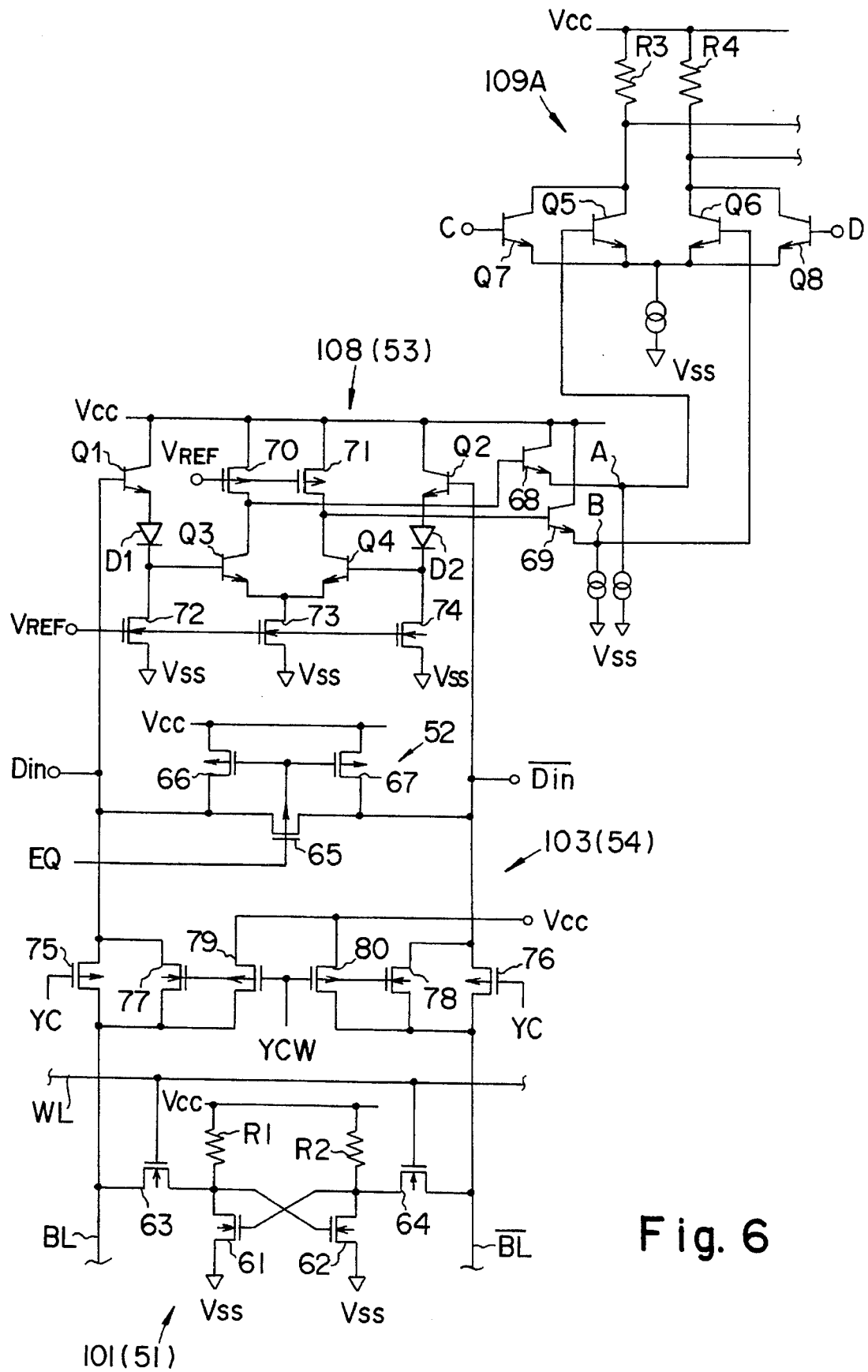
FIG. 6 is a circuit diagram showing bit lines, a sense amplifier, etc. of the SRAM of the first embodiment.

Data read from the memory cell selected based on the address data Add ($Add_0$–$Add_n$) is read into the sense amplifier 108 via the selected bit lines BL and /BL. The sense amplifier 108 amplifies the received data and outputs it to the output circuit 109. The output circuit 109 further amplifies the data, amplified by the sense amplifier 108, and outputs that data to the external device 200 as output data Dout. FIG. 6 shows parts of the memory cell 51, the bit driver 103, the equalizer 52 and the sense amplifier 108 in the memory cell array 101. The structures of the memory cell 51, bit driver 103 and sense amplifier 108 of this embodiment are substantially the same as those of the memory cell 51, bit driver 54 and sense amplifier 53 in the conventional SRAM as shown in FIG. 1. Therefore, the circuit in FIG. 6 includes many elements which are the same as the circuit shown in FIG. 1, so that corresponding or identical components will be denoted by like or same reference numerals to avoid repeating their descriptions.

Figure 2:
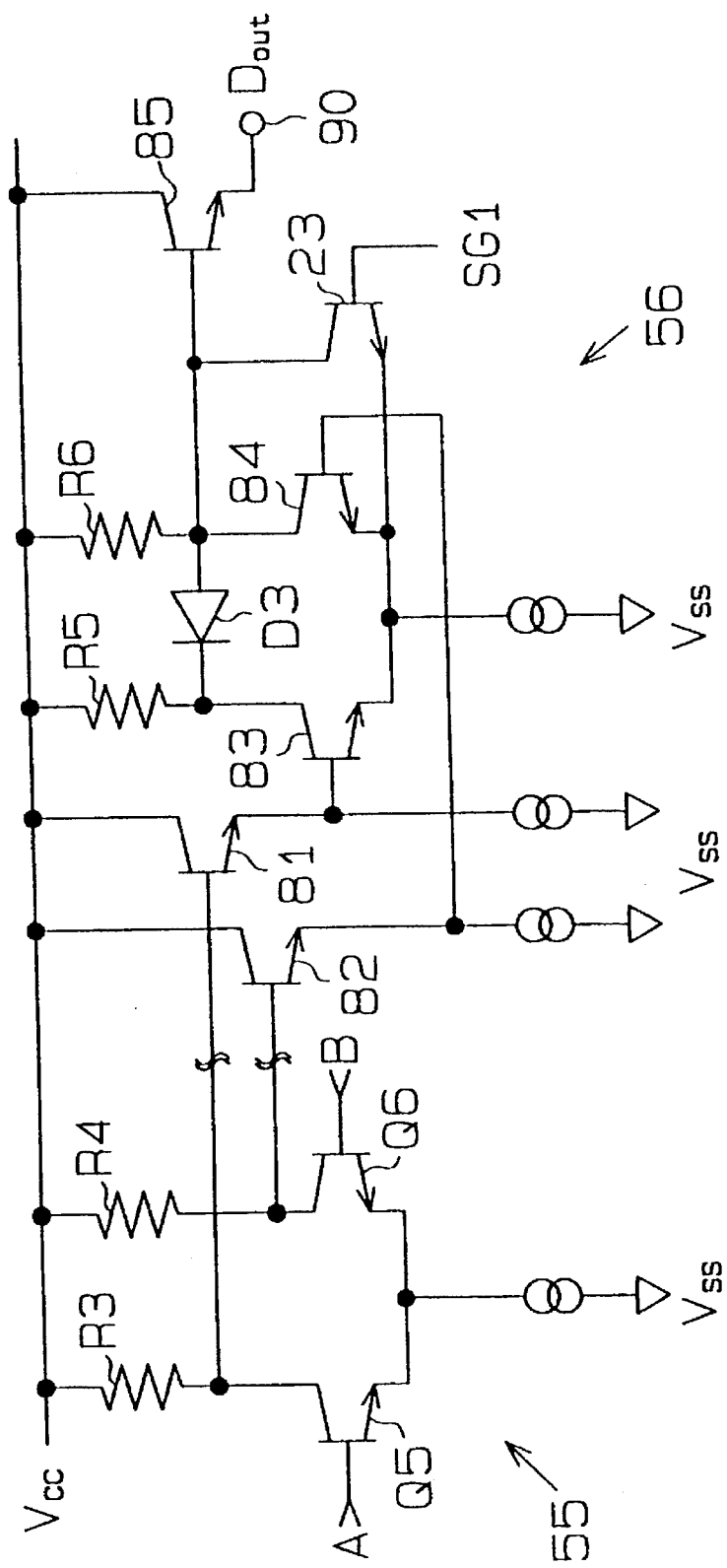
FIG. 2 is a circuit diagram showing a main sense amplifier and an output buffer of the conventional SRAM.
Figure 3:
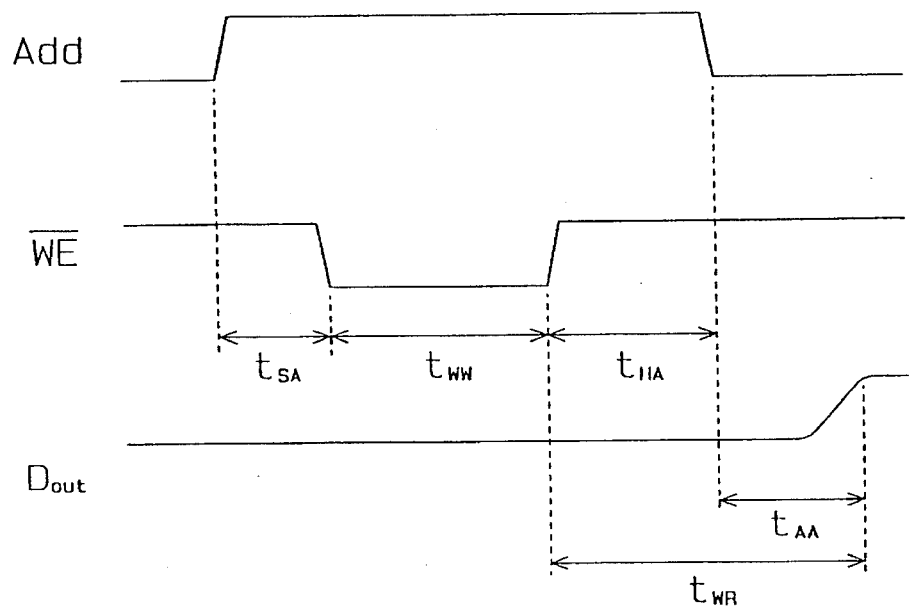
FIG. 3 is a time chart illustrating data writing operations in the conventional SRAM.
Figure 7:
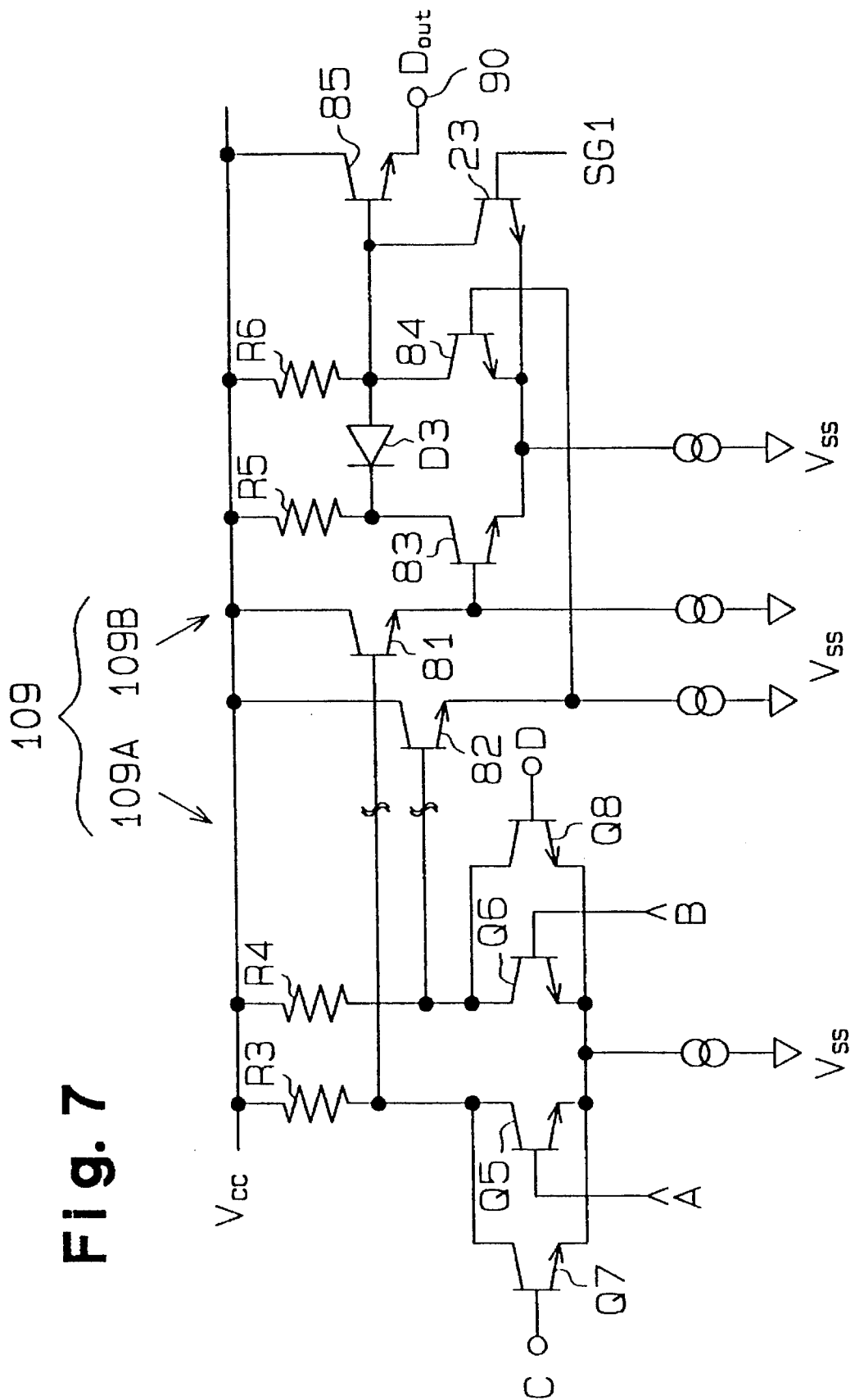
FIG. 7 is a circuit diagram showing a main sense amplifier and an output buffer of the SRAM of the first embodiment.

FIGS. 6 and 7 show the structure of the output circuit 109 which has a main sense amplifier (MSA) 109A and an output buffer portion 109B. The structure of the output buffer portion 109B in FIG. 7 is substantially the same as the output buffer portion 56 as shown in FIG. 2. The MSA 109A in FIG. 7 is similar to the main sense amplifier (MSA) 55 shown in FIG. 2, but further includes two additional NPN transistors Q7 and Q8.

The NPN transistor Q7 has a collector connected to the collector of the transistor Q5, and an emitter connected to the emitter of the transistor Q5. The base of the NPN transistor Q7 receives, via a node C, a signal produced by the input circuit 106 through the logical combination of the input data Din, equalizer pulse EQ, write enable signal /WE and chip select signal /CS. The NPN transistor Q8 has a collector connected to the collector of the transistor Q6, and an emitter connected to the emitter of the transistor Q6. The base of the NPN transistor Q8 also receives, via a node D, a signal produced by the input circuit 106 in the same manner.

More specifically, the level of the signal input to the node C is maintained at same level as the signal loaded on the bit line /BL during the time L-level equalizer pulse EQ is output with the chip select signal /CS at a L level and the write enable signal /WE at a H level. The signal input to the node C has an intermediate level otherwise. The signal input to the node D maintains the same level as that of the signal loaded on the bit line BL during the time the L-level equalizer pulse EQ is output with the chip select signal /CS at a L level and the write enable signal /WE at a H level. The signal input to the node D has an intermediate level otherwise.

When the write enable signal /WE falls to the L level, with the chip select signal /CS at a L level, the input data Din, /Din is written in a specific memory cell 51. Should the input data Din, /Din be written in that memory cell 51 with the bit line BL high and the bit line /BL low, a H-level signal would then be input via the bit line BL to the base of the transistor Q1, causing the base of the transistor Q3 to go high. If, during this time, a L-level signal is input via the bit line /BL to the base of the transistor Q2, the base of the transistor Q4 will fall low.

Writing of the input data Din, /Din into the memory cell 51 is completed when the write enable signal /WE rises high. Responding to this, the transistor 23 shown in FIG. 7 turns off and the transistor 85 starts to provide the output terminal 90 with written data (i.e., the input data Din) as output data Dout. Additionally, in response to the completion of the writing, the L-level equalizer pulse EQ is input to the equalizer 52 from the external device 200. Then, the equalizer 52 short-circuits both bit lines BL and /BL so that the potentials of the bit lines BL and /BL become equal to each other at a level close to the high potential $V_{CC}$. Consequently, the currents flowing through both transistors Q3 and Q4 equalize, setting the potentials at the nodes A and B of the sense amplifier 108 equal to each other. This further results in the potentials of the bases of both NPN transistors Q5 and Q6 in the MSA 109A becoming equal.

At this time, a low level signal like that of the signal on the bit line /BL, is applied to the node C while the L-level equalizer pulse EQ is output. Likewise, a high level signal like that of the signal on the bit line BL, is applied to the node D while the L-level equalizer pulse EQ is output.

Figure 4:
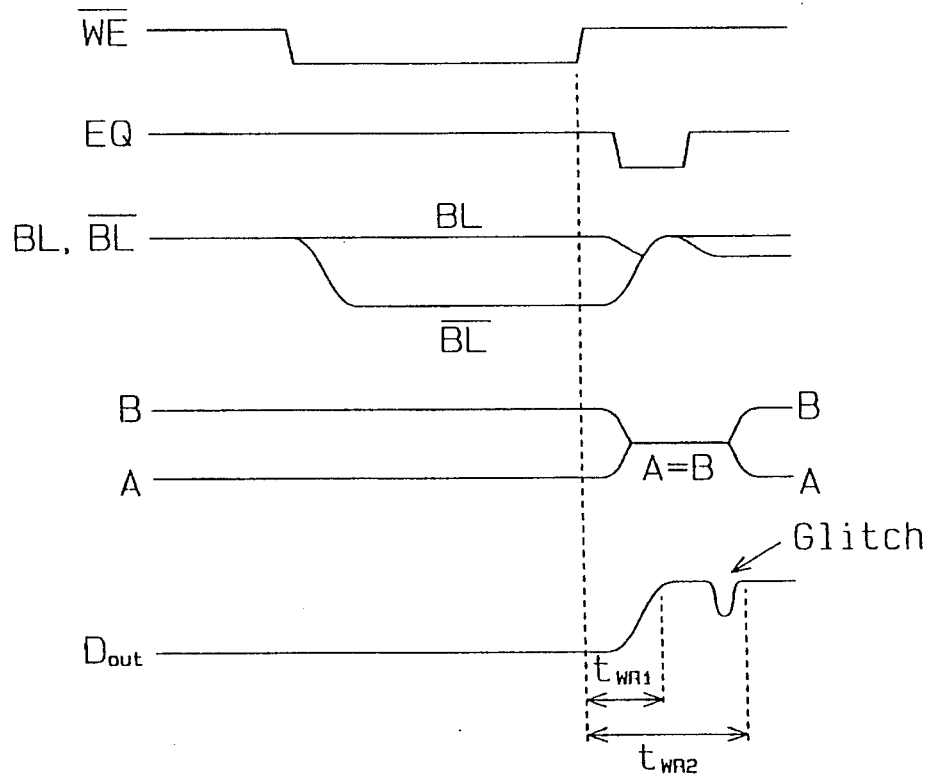
FIG. 4 is a time chart illustrating the time immediately following data writing operations when a disruption or glitch occurs in data reading operations.

Since the potential at the base of the NPN transistor Q7 changes to a L level and since the potential at the base of the NPN transistor Q8 changes to a H level, the bases of the transistors 81 and 82 are prevented from changing to an intermediate potential level at the same time. The potentials at those bases are kept at levels in accordance with the input data Din, /Din. Since the bases of the transistors 81 and 82 do not simultaneously change to an intermediate level, the currents flowing through the NPN transistors 83 and 84 in the output buffer portion 109B differ from each other. Consequently, the potential of output data Dout will not undergo a change to any intermediate level, but will be maintained at a level corresponding to the input data Din. As a result, the output data Dout from the SRAM of this embodiment does not have a glitch or anomaly as shown in FIG. 4 during the time the equalizer pulse EQ is output.

Figure 8:
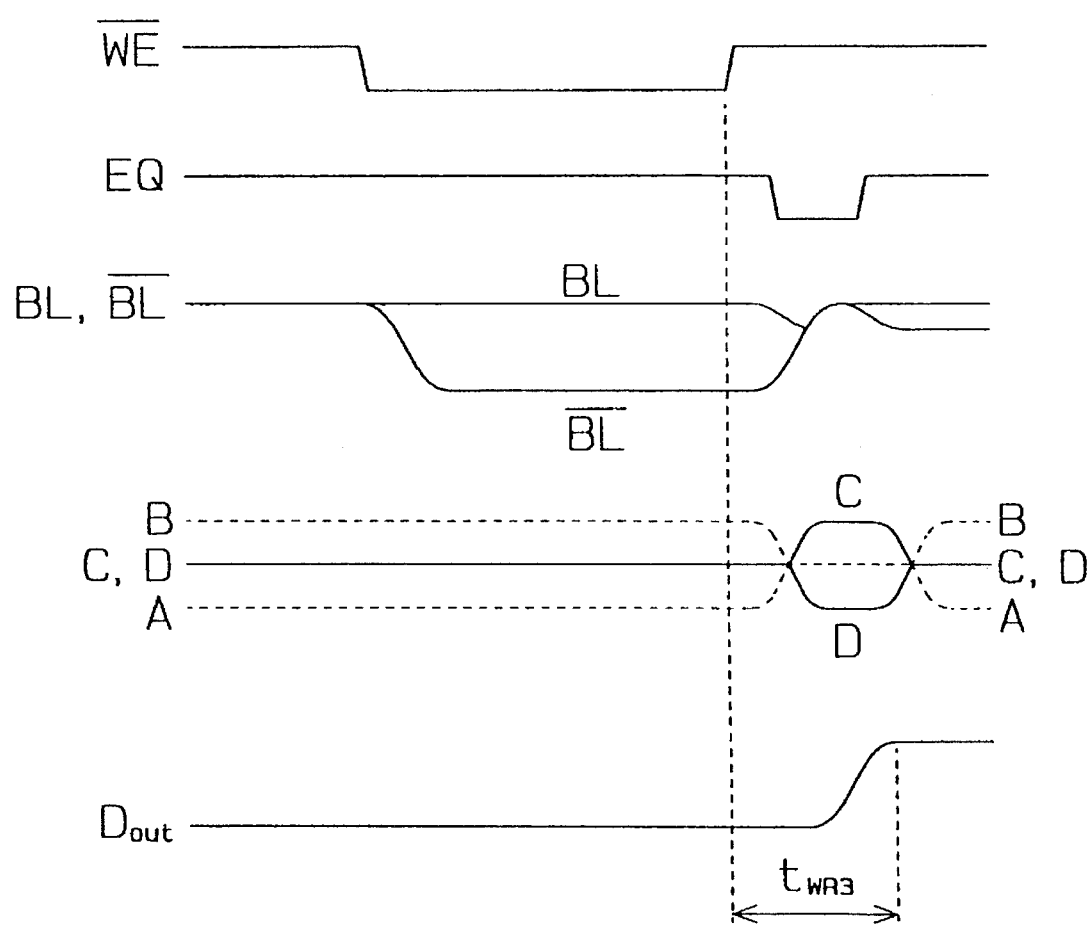
FIG. 8 is a time chart illustrating data writing mode in the first embodiment.

As shown in FIG. 8, when the equalizer pulse EQ is switched to an H level from an L level, the potential difference between the bit lines BL and /BL gradually becomes larger. Accordingly, the potential at the node A falls to the L level from the intermediate level, and the potential at the node B rises to the H level from the intermediate level. At this time, an intermediate voltage level is applied to the nodes C and D, as well as the bases of the NPN transistors Q7 and Q8.

According to this embodiment, the MSA 109A is constructed with emitter coupled logic (ECL) including four NPN transistors Q5 to Q8. The base potentials of the NPN transistors Q7 and Q8 are controlled at levels so that the written data (i.e., input data Din) is forcibly output as output data Dout during equalization (while the L-level equalizer pulse EQ is output). According to this embodiment, therefore, the output data Dout will not change to any intermediate level, immediately following a writing operation and consequently will not produce any anomalous output of data Dout during reading operations. In addition, the write recovery time $t_{WR3}$ in this embodiment shown in FIG. 8 is shorter than the conventional write recovery time $t_{WR2}$ shown in FIG. 4, permitting the reading time immediately after data writing to be shortened.

Second Embodiment

Figure 9:
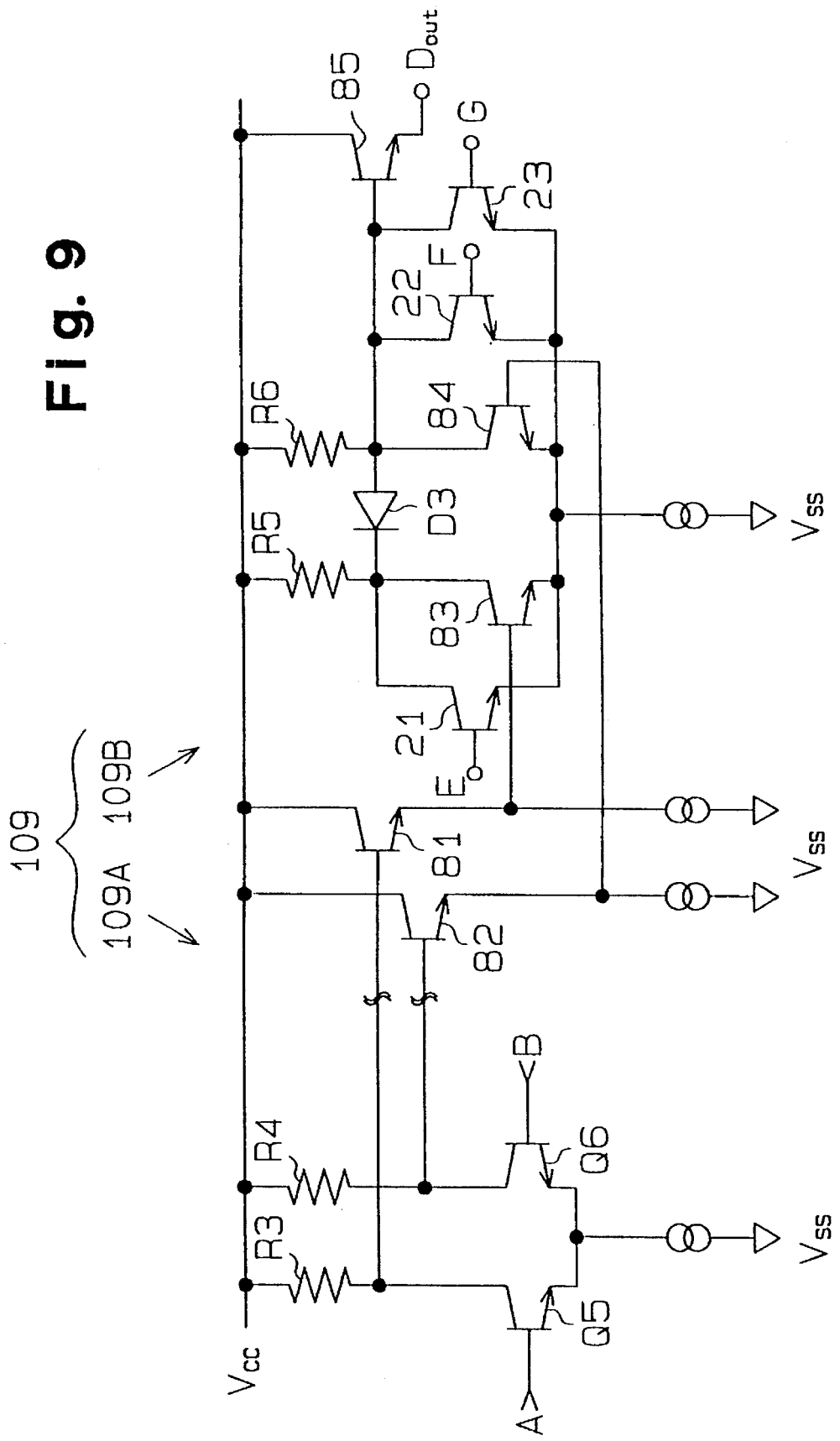
FIG. 9 is a circuit diagram showing a main sense amplifier and an output buffer of an SRAM according to a second embodiment of this invention.

A second embodiment of this invention will now be described with reference to FIG. 9, which shows a main sense amplifier (MSA) 109A and an output buffer portion 109B in the output circuit 109 of the second embodiment. The MSA 109A is substantially the same as the main sense amplifier (MSA) 55 as shown in FIG. 2, although the output buffer portion 109B differs from the output buffer portion 56 in FIG. 2.

In the output buffer portion 109B, the NPN transistor 21 has a collector connected to the collector of the transistor 83 and an emitter connected to the emitter of the transistor 83. A node E at the base of the NPN transistor 21 receives a signal obtained through the logical combination of the input data Din, equalizer pulse EQ, write enable signal /WE and chip select signal /CS. That is, the signal input to the node E in this embodiment is equivalent to the signal input to the node D in the first embodiment. The NPN transistor 22 has a collector connected to the collector of the transistor 84 and an emitter connected to the emitter of the transistor 84. A node F at the base of the NPN transistor 22 receives a signal obtained through the logical combination of the input data Din, equalizer pulse EQ, write enable signal /WE and chip select signal /CS. That is, the signal input to the node F in this embodiment is equivalent to the signal input to the node C in the first embodiment.

According to this embodiment, as in the first embodiment, the nodes E and F, the bases of the NPN transistors 21 and 22, receive signals obtained through the logical combination of the input data Din, equalizer pulse EQ, write enable signal /WE and chip select signal /CS. Therefore, the written data (i.e., input data Din) is forcibly output as output data Dout during equalization (while the L-level equalizer pulse EQ is output). In other words, the provision of the transistors 21 and 22 prevents the levels of the collectors of the transistors 83 and 84 from becoming an intermediately level. As a result, the output data Dout will not change to an intermediate level and will not produce any glitches or anomalies.

Third Embodiment

Figure 10:
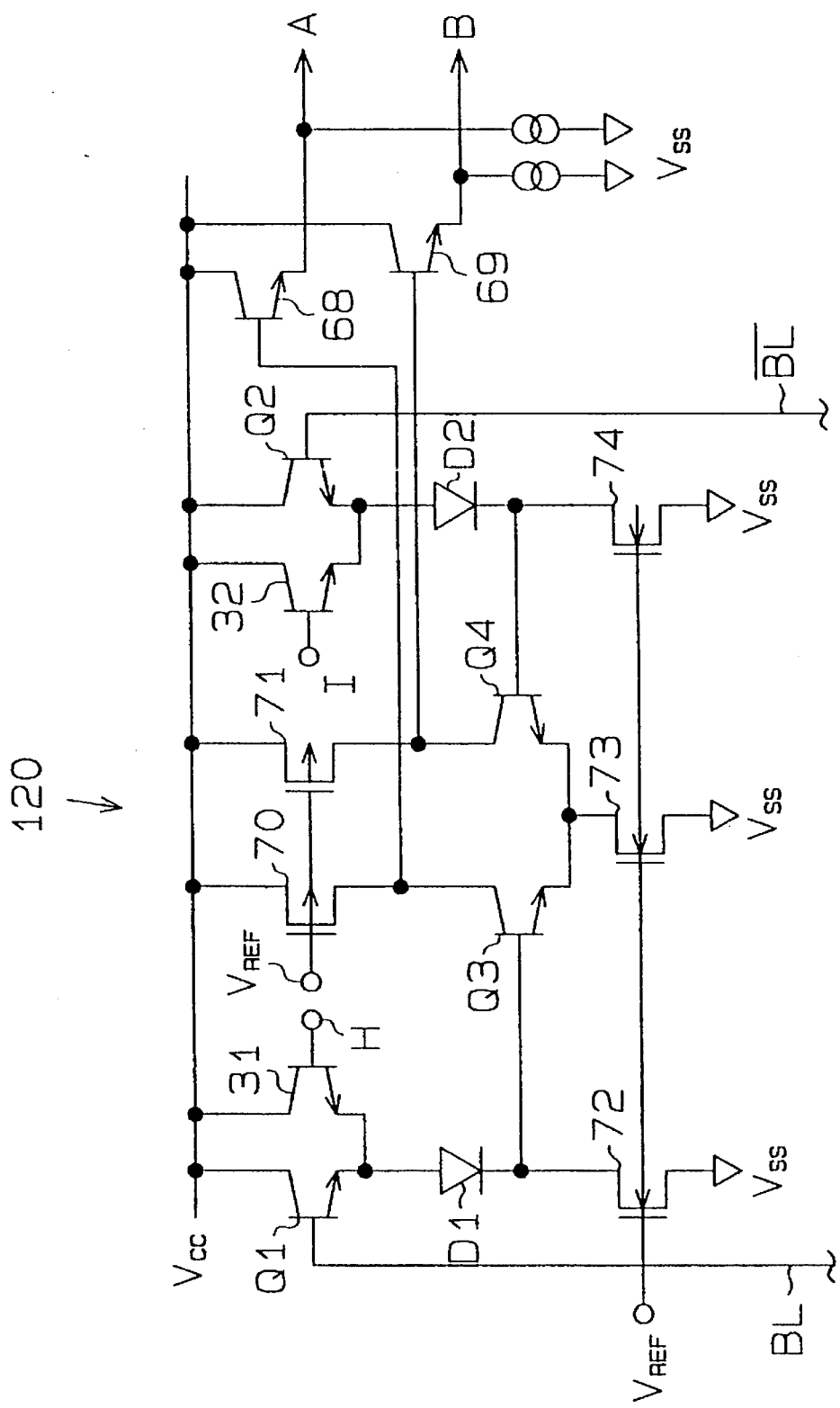
FIG. 10 is a circuit diagram showing a main sense amplifier and an output buffer of an SRAM according to a third embodiment of this invention.

A third embodiment of this invention will now be described with reference to FIG. 10, which shows a sense amplifier 120 of this embodiment. This sense amplifier 120 has two additional NPN transistors 31 and 32 which are not included in the sense amplifier 53 shown in FIG. 1.

The NPN transistor 31 has a collector connected to the collector of the transistor Q1 and an emitter connected to the emitter of the transistor Q1. A node H at the base of the NPN transistor 31 receives a signal obtained through the logical combination of the input data Din, equalizer pulse EQ, write enable signal /WE and chip select signal /CS. That is, the signal input to the node H in this embodiment is equivalent to the signal input to the node D in the first embodiment.

The NPN transistor 32 has a collector connected to the collector of the transistor Q2 and an emitter connected to the emitter of the transistor Q2. A node I at the base of the NPN transistor 32 receives a signal obtained through the logical combination of the input data Din, equalizer pulse EQ, write enable signal /WE and chip select signal /CS. That is, the signal input to the node I in this embodiment is equivalent to the signal input to the node C in the first embodiment.

According to this embodiment, as in the first embodiment, the nodes H and I as well as the bases of the NPN transistors 31 and 32 receive signals obtained through the logical combination of the input data Din, equalizer pulse EQ, write enable signal /WE and chip select signal /CS. Therefore, the written data (i.e., input data Din) is forcibly output as output data Dout during equalization (while the L-level equalizer pulse EQ is output). In other words, the use of the transistors 31 and 32 as described prevents the levels of the bases of the transistors Q3 and Q4 from changing to that of an intermediate level. Since the output level data Dout makes no change to an intermediate level, no anomaly or glitch will be produced in the output of data Dout.

Fourth Embodiment

Figure 11:
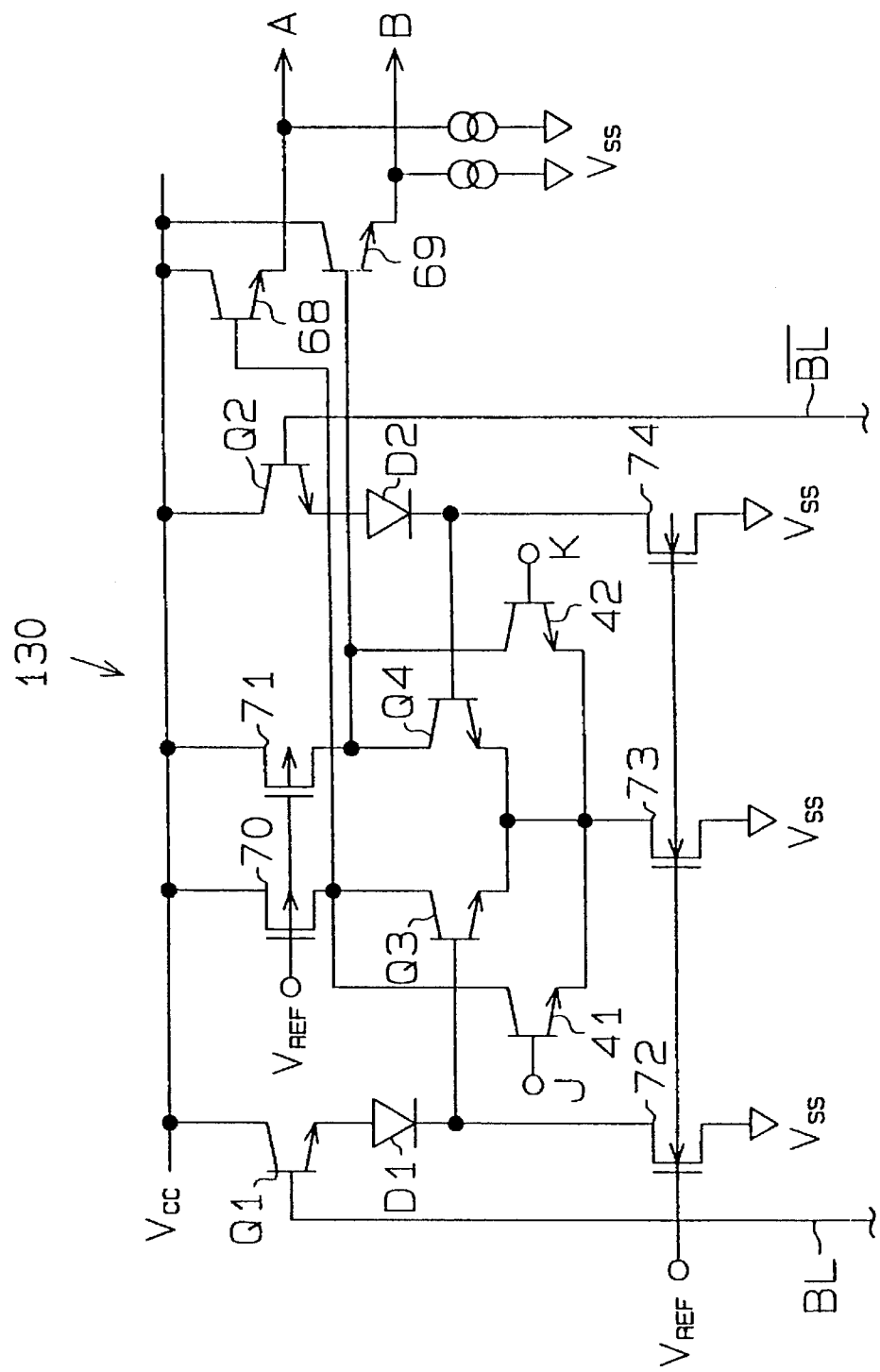
FIG. 11 is a circuit diagram showing a sense amplifier of an SRAM according to a fourth embodiment of this invention.
Figure 12:
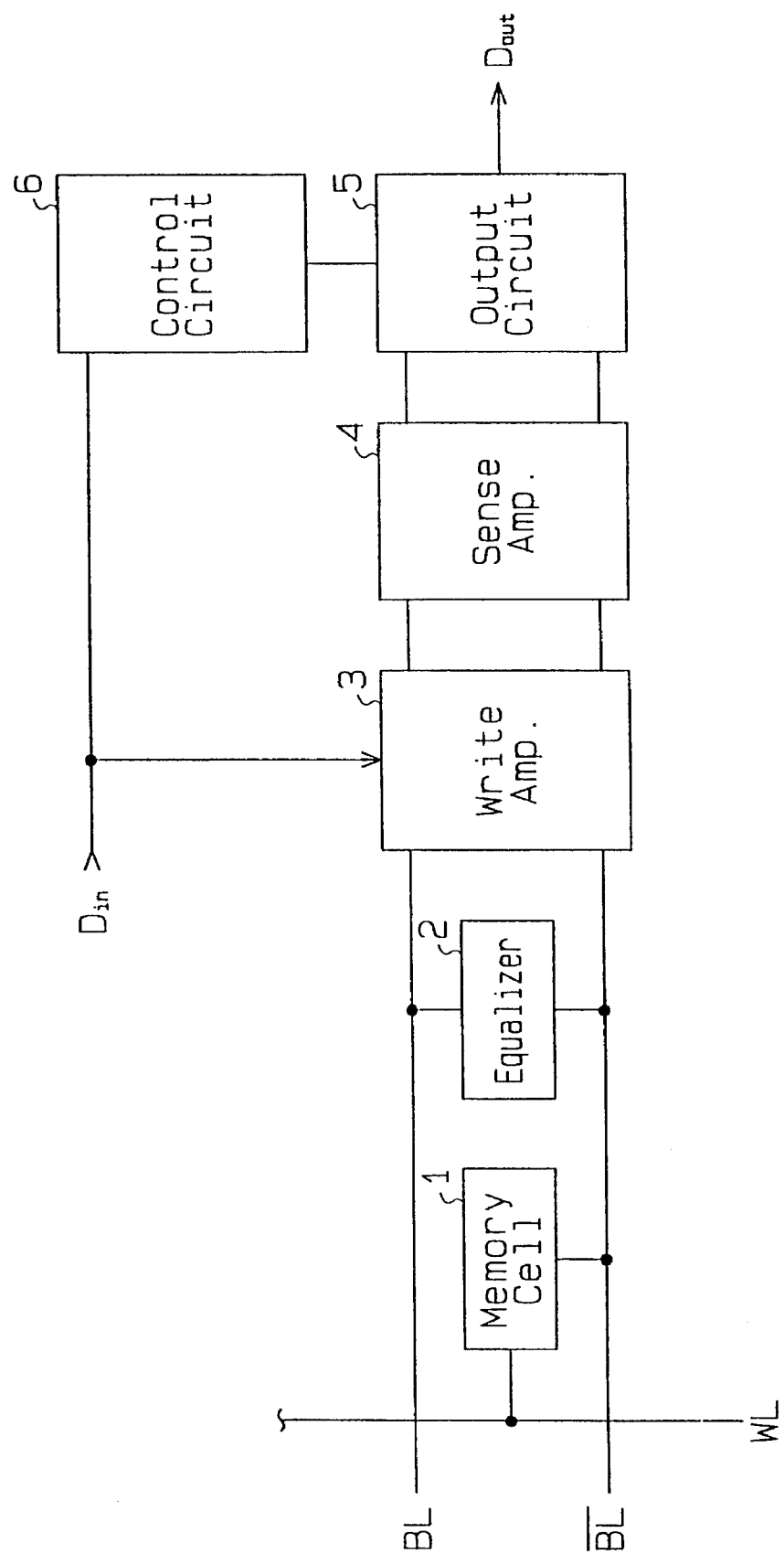
FIG. 12 is a schematic illustration showing essential parts of the present invention embodied as the first through fourth embodiments.

A fourth embodiment of this invention will now be described with reference to FIG. 11, which shows a sense amplifier 130 of this embodiment. This sense amplifier 130 has two additional NPN transistors 41 and 42 which are not included in the sense amplifier 53 shown in FIG. 1.

The NPN transistor 41 has a collector connected to the collector of the transistor Q3 and an emitter connected to the emitter of the transistor Q3. A node J, at the base of the NPN transistor 41, receives a signal obtained through the logical combination of the input data Din, equalizer pulse EQ, write enable signal /WE and chip select signal /CS. That is, the signal input to the node J in this embodiment is equivalent to the signal input to the node C in the first embodiment.

The NPN transistor 42 has a collector connected to the collector of the transistor Q4 and an emitter connected to the emitter of the transistor Q4. A node K at the base of the NPN transistor 42 receives a signal obtained through the logical combination of the input data Din, equalizer pulse EQ, write enable signal /WE and chip select signal /CS. That is, the signal input to the node K in this embodiment is equivalent to the signal input to the node D in the first embodiment.

According to this embodiment, as in the first embodiment, the nodes J and K, the bases of the NPN transistors 41 and 42, receive a signal obtained through the logical combination of the input data Din, equalizer pulse EQ, write enable signal /WE and chip select signal /CS. Therefore, the written data (i.e., input data Din) is forcibly output as output data Dout during equalization (while the L-level equalizer pulse EQ is output). In other words, the provision of the transistors 41 and 42 prevents the levels of the bases of the transistors 68 and 69 from changing to an intermediately potential level. As a result, the output data Dout will not change to an intermediate level and will experience no anomalies or glitches.

Although only four embodiments of the present invention have been described herein, it should be apparent to those skilled in the art that the present invention may be embodied in many other specific forms without departing from the spirit or scope of the invention. Particularly, it should be understood that this invention may be embodied in the following modes.

Although the sense amplifier 108(53) in each embodiment is a bipolar sense amplifier, it may be replaced with another differential type sense amplifier (e.g., latch type sense amplifier or current mirror type sense amplifier).

Although the memory cell 51 in each embodiment is a high-resistance load cell, it may be replaced with another type of cell (e.g., a complete CMOS type cell, NMOS load cell, PMOS load cell, TFT load cell, TTL bipolar cell or ECL bipolar cell).

Further, transistors similar to the above-described transistors Q7, Q8, 21, 22, 31, 32, 41 and 42 may be additionally provided at the differential amplifier portion of the read circuit located at the subsequent stage of the sense amplifier 108(53), other than the MSA 109A and the output buffer portion 109B. In this case, to achieve the same function and advantages of the first embodiment, the written data (input data Din) should be forcibly output as output data Dout during equalization (while the L-level equalizer pulse EQ is output).

The present invention may also be applied to a DRAM of a type which equalizes the bit lines BL and /BL in a reading operation immediately after writing.

Therefore, the present examples and embodiments are to be considered as illustrative and not restrictive and the invention is not to be limited to the details given herein, but may be modified within the scope of the appended claims.

What is claimed is:

1. A data reading method for use in a semiconductor memory device having a plurality of memory cells and plural pairs of bit lines, comprising the steps of:

writing input data supplied to the memory device in one of the memory cells via a pair of bit lines;

equalizing the potential levels of the pair of bit lines used in said data writing after the writing of said input data is completed; and forcibly outputting said input data as output data from the memory device during said equalization in order to prevent the generation of a glitch in level of the output data.

2. A semiconductor memory device comprising:

a memory cell connected to a pair of bit lines and a word line;

a write amplifier for writing input data in said memory cell via the pair of bit lines;

an equalizer for equalizing the potential levels of the pair of bit lines after said input data is written to said memory cell;

a sense amplifier coupled to the pair of bit lines;

an output circuit for reading data from said memory cell via the pair of bit lines and said sense amplifier and for outputting said read data as output data; and means for forcing said output circuit to output the input data as output data during the equalization of the pair of bit lines by said equalizer in order to prevent the generation of a glitch in level of the output data.

3. The semiconductor memory device according to claim 2 further comprising a circuit for generating a signal from a combination of input data, an equalizer pulse, a write enable signal and a chip select signal and for supplying the combined signal to said forcing means.

4. The semiconductor memory device according to claim 2, wherein said output circuit includes a main sense amplifier and an output buffer portion, each of which has a differential amplifier comprising a pair of emitter-coupled transistors; and wherein said forcing means comprises a pair of emitter-coupled transistors coupled to the pair of transistors of the differential amplifier in said main sense amplifier.

5. The semiconductor memory device according to claim 2, wherein said output circuit includes a main sense amplifier and an output buffer portion, each of which has a differential amplifier comprising a pair of emitter-coupled transistors; and wherein said forcing means comprises a pair of emitter-coupled transistors coupled to the pair of transistors of the differential amplifier in said output buffer portion.

6. The semiconductor memory device according to claim 2, wherein said sense amplifier circuit includes:

a differential amplifier having a first pair of emitter-coupled transistors; and an emitter follower having a second pair of transistors corresponding to said first pair of emitter-coupled transistors, wherein said second pair of transistors couple to said bit lines and provide said differential amplifier with the potentials of the associated bit lines, and wherein said forcing means comprises a third pair of transistors, the emitters of which respectively couple to the emitters of the transistors forming said emitter follower.

7. The semiconductor memory device according to claim 2, wherein said sense amplifier includes a differential amplifier having a first pair of emitter-coupled transistors; and wherein said forcing means comprises a second pair of emitter-coupled transistors coupled to the emitter-coupled transistors of said differential amplifier.

8. The semiconductor memory device according to claim 2, wherein the semiconductor memory device is a static RAM.

* * * * *